(12) United States Patent
Tagomori

(10) Patent No.: US 6,204,702 B1
(45) Date of Patent: Mar. 20, 2001

(54) ARRANGEMENT FOR SUPPLYING CIRCUITS WITH DIRECT CURRENTS

(75) Inventor: Reiji Tagomori, Saitama-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 08/568,554

(22) Filed: Dec. 7, 1995

Related U.S. Application Data

(63) Continuation of application No. 08/162,280, filed on Dec. 7, 1993, now abandoned.

(30) Foreign Application Priority Data

Dec. 9, 1992 (JP) .................................................. 4-329609

(51) Int. Cl.[7] .................................................. H03K 17/22
(52) U.S. Cl. ..................... 327/143; 327/545; 326/100; 307/126
(58) Field of Search ................ 307/296.1, 296.4, 307/296.6, 459, 490, 491, 126, 130; 327/143, 362, 530, 545; 326/79, 100

(56) References Cited

U.S. PATENT DOCUMENTS

| | | | |
|---|---|---|---|
| 4,531,065 | * | 7/1985 | Nakayama et al. .................. 307/459 |
| 4,924,112 | * | 5/1990 | Anderson et al. ................. 307/296.4 |
| 5,021,680 | * | 6/1991 | Zaw Win et al. ................. 307/296.1 |
| 5,047,663 | * | 9/1991 | Lee et al. .......................... 307/296.4 |
| 5,140,183 | * | 8/1992 | Takenaka .......................... 307/296.4 |
| 5,153,452 | * | 10/1992 | Iwamura et al. .................. 307/296.1 |
| 5,208,488 | * | 5/1993 | Takiba ............................... 307/296.4 |
| 5,225,716 | * | 7/1993 | Endo et al. ........................... 307/491 |
| 5,317,207 | * | 5/1994 | Mortensen ........................ 307/296.1 |

FOREIGN PATENT DOCUMENTS 59-45258  11/1984  (JP) .

* cited by examiner

*Primary Examiner*—Terry D. Cunningham
(74) *Attorney, Agent, or Firm*—Banner & Witcoff, Ltd.

(57) ABSTRACT

An analog IC includes analog circuit components and digital circuit components formed from plural I$^2$L circuits. The analog IC is supplied with first and second voltages from first and second direct current sources. The analog circuit components are driven by the first voltage and the I$^2$L circuits are driven by the second voltage. At least one I$^2$L circuit is activated before the analog IC receives the first voltage while the remaining at least one I$^2$L circuit is activated after the analog IC receives the first voltage, a switching circuit switching on and off the transmission of the second voltage to the remaining at least one I$^2$L circuit according to a voltage level of the first voltage.

7 Claims, 3 Drawing Sheets

ARRANGEMENT FOR SUPPLYING CIRCUITS WITH DIRECT CURRENTS

This application is a continuation of application Ser. No. 08/162,280, filed Dec. 7, 1993, now abandoned.

FIELD OF THE INVENTION

The present invention generally relates to the field of electrical circuits, and more particularly, is directed to an arrangement for separately supplying at least two portions in an IC (Integrated Circuit) with direct currents from different power sources, for instance, where the IC includes both analog circuit components and digital circuit components.

BACKGROUND OF THE INVENTION

Recently, $I^2L$ (Integrated Injection Logic) circuits, which are known as a kind of digital circuit, have been employed in an analog IC in order to achieve higher integration and advanced functions in the analog IC since $I^2L$ circuits are suited for coexisting with individual analog circuits. In this case, the analog IC including some $I^2L$ circuits is typically designed so that it receives direct currents from at least two different power sources for respectively being supplied to the $I^2L$ circuits and the remaining analog circuits in order to prevent electrical interference between these two types of circuit and/or to supply different voltages to these respective types of circuit.

In the case where the analog IC has at least two routes for respectively supplying direct currents received from different power sources, the analog IC can be set in a waiting state, for example, when the first power supply is in an off-state but the second power supply is in an on-state. In a bus-line interface of an IC for instance, during the waiting state, the $I^2L$ circuits receive direct currents by the second power supply, while the remaining analog circuits do not receive direct currents due to the off-state of the first power supply. By this process, before the analog circuits are activated, bus-data can be set into the Analog IC and held in some of the $I^2L$ circuits, or bus-lines at the output interface of the analog IC may be supplied with data held in the activated $I^2L$ circuits.

However, in the conventional analog IC which includes a plurality of $I^2L$ circuits, all the $I^2L$ circuits receive currents, and in spite of some of the $I^2L$ circuits being unused, these $I^2L$ circuits are activated. For this reason, the greater the number of unused $I^2L$ circuits, the more idle current is wasted. As a result, such analog IC gets to have a high electricity consumption.

SUMMARY OF THE INVENTION

In accordance with the present invention, a circuit which is suitable for being driven by at least two different direct current sources is provided. In the circuit, first portion is driven by a voltage supplied from a first direct current source, and a second portion is driven by a voltage supplied from a second direct current source. Moreover, a third portion is provided in the circuit, and is driven by the voltage supplied from the second direct current source on a condition of the existence of the voltage supply from the first direct current source to the circuit.

It is therefore an object of the present invention to provide an arrangement of a circuit by which a wasteful electricity consumption is eliminated.

Another object of the present invention is to provide an IC having different types of individual circuits in which only desired circuits are activated prior to the activation of the whole IC.

The above and other objects of the present invention will become clearer upon an understanding of the illustrative embodiments described below. Various advantages, which may not be referred to herein, will also occur to those skilled in the art upon employment of the present invention in practice in view of the disclosure herein.

DETAILED DESCRIPTION OF PREFERRED EMBODIMENTS

Representative embodiments of the present invention will now be explained with reference to the accompanying drawings.

Figure 1:
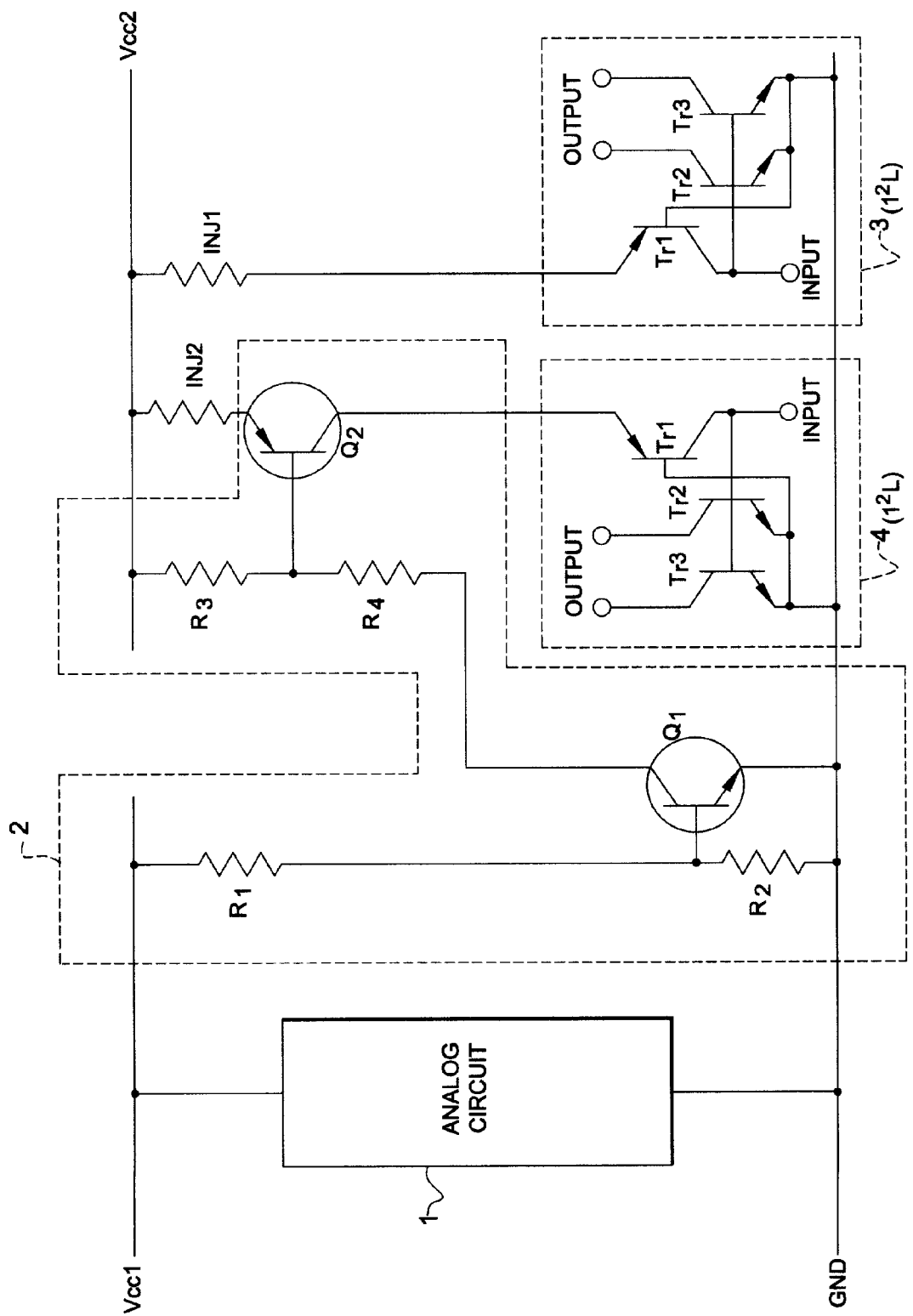
FIG. 1 is a circuit diagram illustrating an arrangement of a circuit in accordance with an embodiment of the present invention.

FIG. 1 is a circuit diagram illustrating an arrangement of a circuit in accordance with an embodiment of the present invention, which is applied to an analog IC including a plurality of $I^2L$ circuits.

In FIG. 1, analog circuit 1, which represents all individual analog circuits provided in the IC, is supplied with direct currents from an external power source Vcc1, while $I^2L$ circuits 3 and 4 receive direct currents from another external power source Vcc2. In other words, analog circuit 1 is connected between the power supply line of power source Vcc1 and the ground line of ground potential GND. In addition, resistors R1 and R2, arranged in series, are also connected between these lines. The voltage on the line between resistors R1 and R2 is supplied to the base of NPN transistor Q1 for switching. In addition, the emitter of transistor Q1 is directly connected to the ground line of ground potential GND, while the collector of transistor Q1 is connected to the power supply line of power source Vcc2 via resistors R3 and R4 arranged in series. The voltage on the line between resistors R3 and R4 is supplied to the base of PNP transistor Q2 for switching. In this case, note that this arrangement of resistors R1 to R4 and transistors Q1 and Q2 forms switching circuit 2.

In addition, resistor INJ1 and $I^2L$ circuit 3 are connected in series between the power supply line of power source Vcc2 and the ground line of ground potential GND. Moreover, resistor INJ2, the path from emitter to collector of transistor Q2 and $I^2L$ circuit 4 are also connected in series between the above two lines. Each of the $I^2L$ circuits 3 and 4 comprises PNP transistor Tr1, and two NPN transistors Tr2 and Tr3 which are arranged in a form to provide current bias to the bases of transistors Tr2 and Tr3 by transistor Tr1. In this case, each output level from the collector of transistors Tr2 and Tr3 is in inverse relation to the corresponding input level. In each of $I^2L$ circuits 3 and 4, transistors Tr2 and Tr3 may be arranged in the form of a multi-collector transistor as a variation.

In this embodiment, during the waiting state, the power supply from power source Vcc1 is in an off-state, but the power supply from power source Vcc2 is in an on-state. In addition, $I^2L$ circuit 3 is required to be active in the waiting state, while $I^2L$ circuit 4 is not required to be active during the waiting state. Note that this embodiment is exemplary and not limited to the number of I²L circuits being on or off to one each. It is possible to connect a plurality of I²L circuits required to be active in the waiting state with the power supply line of power source Vcc2, and also possible to connect a plurality of I²L circuits which are not required to be active during the waiting state with the collector of transistor Q2.

According to the above described construction, the operation of this embodiment will now be explained. In the waiting state, since the power supply from power source Vcc1 is in the off-state, both transistors Q1 and Q2 also are in an off-state. Therefore, no current is supplied to I²L circuit 4. However, a current is supplied to I²L circuit 3 from power source Vcc2. After the waiting state, the power supply from power source Vcc1 changes over from the off-state into the on-state. Since the direct current from power source Vcc1 flows into resistors R1 and R2, transistor Q1 switches into the on-state. Thus, direct current from power source Vcc2 flows into resistors R3 and R4, and transistor Q2 switches into the on-state. As a result, current is supplied to I²L circuit 4 from power source Vcc2 via resistor INJ2 in order to activate I²L circuit 4.

When the voltage of the power supply from power source Vcc1 is decreased so that the voltage VBE between the base and emitter of transistor Q1 becomes less than a base to emitter turn-on voltage (that is approximately 0.7V), transistor Q1 is switched off. Therefore, no current flows through resistors R3 and R4. Since the voltage at the base of transistor Q2 then becomes equal to the level of power source Vcc2, transistor Q2 is switched off. As a result, the current supplied to I²L circuit 4 ceases.

In accordance with this embodiment, I²L circuit 3 receives the direct current from power source Vcc2 without regard to the state of the power supplied from power source Vcc1. No current is supplied to I²L circuit 4 from power source Vcc2 when the power supplied from power source Vcc1 is in an off-state. By this process, no idle current for I²L circuit 4 is wasted during the waiting state.

Figure 2:
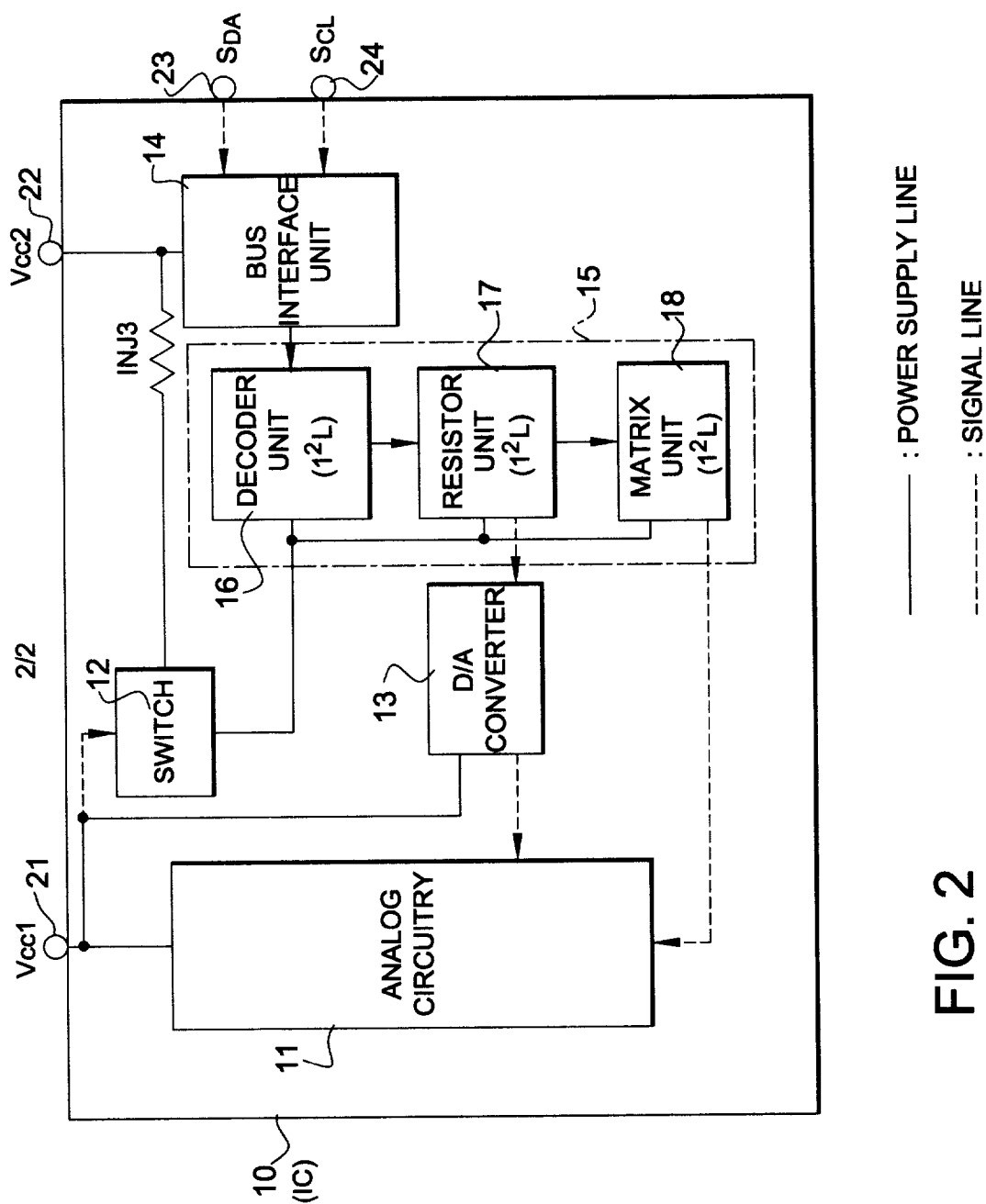
FIG. 2 is a block diagram illustrating an analog IC having some $I^2L$ circuits in accordance with another embodiment of the present invention.

FIG. 2 is a block diagram illustrating an analog IC including I²L circuits in accordance with another embodiment of the present invention. In FIG. 2, analog IC 10 has four input terminals comprising terminal 21 for receiving the voltage from direct current source Vcc1, terminal 22 for receiving the voltage from direct current source Vcc2, terminal 23 for receiving data signal $S_{DA}$ and terminal 24 for receiving control signal $S_{CL}$.

Analog IC 10 includes analog circuitry 11 having a great number of analog circuit components and D/A (digital to analog) converter 13 are respectively connected to terminal 21 in order to receive the voltage of power source Vcc1. In addition, IC 10 includes digital circuitry comprising bus-interface unit 14 and I²L circuitry 15. Bus-interface unit 14 is directly connected to terminal 22 in order to receive the voltage of power source Vcc2, and is also connected to terminals 23 and 24 in order to receive data signal $S_{DA}$ and control signal $S_{CL}$. However, I²L circuitry 15 includes three individual I²L circuits, namely, I²L decoder unit 16, resistor unit 17 and matrix unit 18, and these units are respectively connected to terminal 22 via resistor INJ3 and switching circuit 12. Switching circuit 12 switches on and off power supplied from power source Vcc2 to each unit of I²L circuitry 15 in response to the state of the power supply from power source Vcc1 in the same manner as the above-described embodiment. By the operation of switching circuit 12, I²L circuitry 15 receives the voltage from power source Vcc2 only when the voltage of power source Vcc1 is supplied to terminal 21. In circuitry 15, the following operation is executed when receiving the voltage. Decoder unit 16 decodes the signal supplied from bus-interface unit 14, and supplies an output signal to resistor unit 17. Resistor unit 17 temporarily holds and supplies the signal to matrix unit 18 and D/A converter 13. Both the signal converted by D/A converter 13 and the signal obtained by the matrix arithmetic processed in matrix unit 18 are supplied to analog circuitry 11.

In accordance with the operation of this embodiment, during the waiting state in which the power supplies from power sources Vcc1 and Vcc2 are respectively off and on, bus-interface unit 14 is activated, but I²L circuitry 15 is not activated. Therefore, no electricity consumption is wasted by I²L circuitry 15. Moreover, in this case, since bus-lines in IC 10 are active prior to the power supply from power source Vcc1, the operation on the bus-lines, such as a signal transmission, can be quickly executed when the voltage of power source Vcc1 is supplied to IC 10.

For instance, in the case where analog IC 10 of FIG. 2 comprises approximately 1300 analog circuit components and 1000 gates of I²L circuitry, such as in Toshiba's IC TA8874Z, the electricity current consumption Icc is 12.3 mA according to the conventional manner. However, in accordance with this embodiment, the electricity current consumption Icc can become equal to 1 mA.

Figure 3:
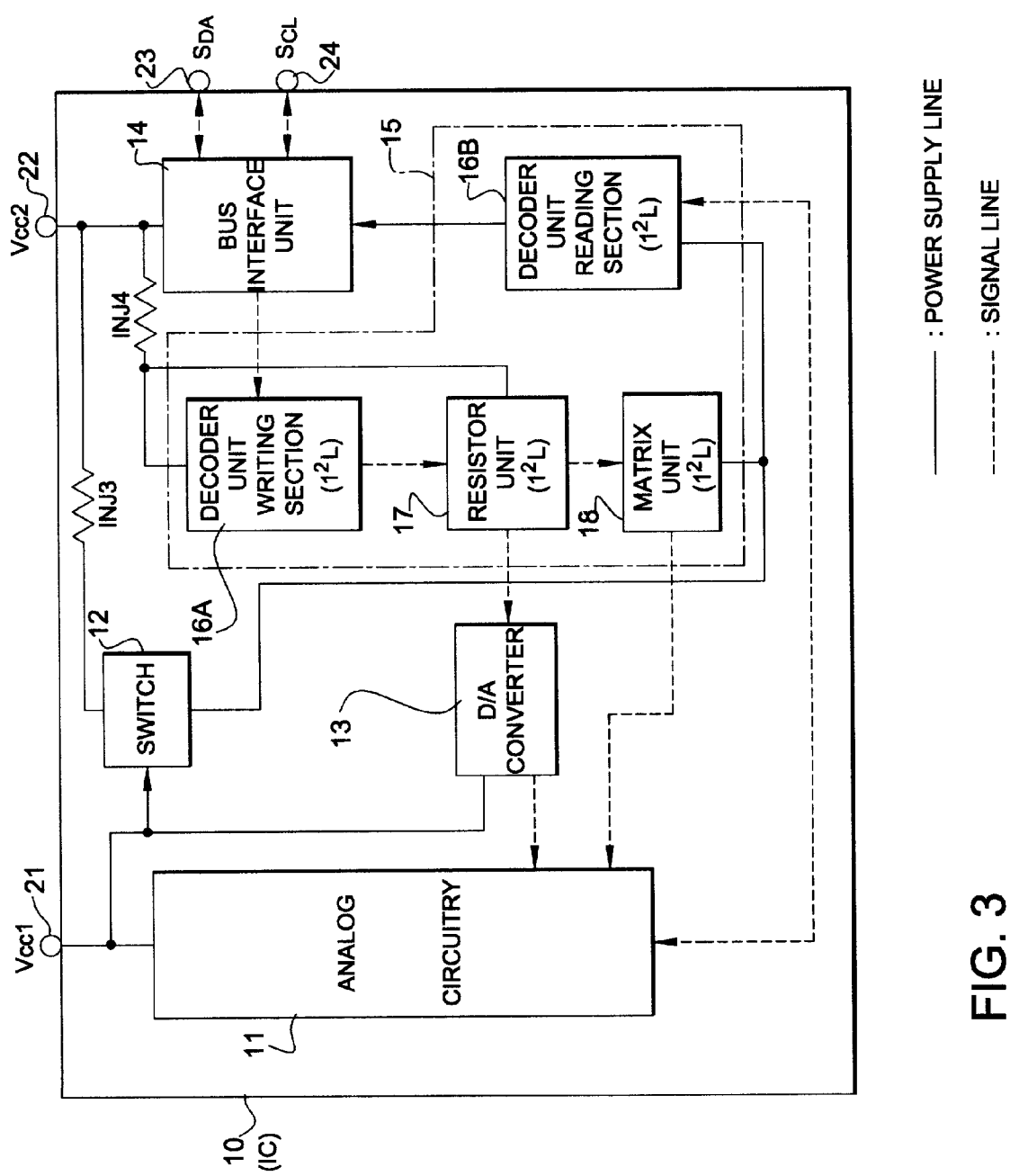
FIG. 3 is a block diagram illustrating an analog IC having some $I^2L$ circuits in accordance with still another embodiment of the present invention.

FIG. 3 is a block diagram illustrating a modification of the analog IC of FIG. 2 in accordance with still another embodiment of the present invention. In this embodiment, the following arrangement is different from the above embodiment. In FIG. 3, I²L circuitry 15 includes resistor unit 17, matrix unit 18 and a decoder unit having a writing section 16A and a reading section 16B. In addition, writing section 16A and resistor unit 17 are directly supplied with the voltage of power source Vcc2 via resistor INJ4. However, by the operation of switching circuit 12, reading section 16B and matrix unit 18 receive the voltage of power source Vcc2 only when the voltage of power source Vcc1 is supplied to terminal 21. In this case, writing section 16A decodes the signal provided from bus-interface unit 14 and supplies an output signal to resistor unit 17, while reading section 16B decodes the signal provided from analog circuitry 11 and supplies an output signal to bus-interface unit 14. In addition, bus-interface unit 14 not only receives data and control signals $S_{DA}$ and $S_{CL}$ from terminals 23 and 24 but also provides output signals to terminals 23 and 24.

In accordance with this embodiment, during the waiting state, since the power supplies from power sources Vcc1 and Vcc2 are respectively in the off and on-states, bus-interface unit 14, writing section 16A of the decoder unit and resistor unit 17 are activated, but reading section 16B of the decoder unit and matrix unit 18 are not activated. By this operation, when the voltage of power source Vcc1 is supplied to IC 10, bus-data can be quickly set up. Moreover, during the waiting state, no electricity consumption is wasted by reading section 16B and matrix unit 18 which are not used for setting up the bus-data.

In the above embodiments, analog ICs, each including a plurality of I²L circuits, are employed, and in each IC the direct currents of two different power sources are separately supplied to the analog circuitry and the digital circuitry. However, the present invention may be applied to any type of IC and electrical device which is driven by at least two direct current sources.

As described above, the present invention provides an arrangement for supplying a circuit with currents from different direct current sources, by which only desired individual circuits are activated prior to the activation of the whole circuit. The desired individual circuits can be selected out of the circuits which are supplied with currents from one of the different direct current sources. Therefore, the present invention also provides an arrangement of a circuit by which a wasteful electricity consumption is eliminated.

While the present invention has been illustrated and described in detail in the drawings and foregoing description, it will be recognized that changes and modifications can and will occur to those skilled in the art. It is therefore intended by the appended claims, to cover any such modifications as fall within the true spirit and scope of the invention.

What is claimed is:

1. In an integrated circuit, circuitry coupled to first and second voltage lines respectively supplied with current from first and second D.C. sources, the first D.C. source being in one of an off-state and an on-state, said circuitry comprising:
   a first circuit portion coupled to the first voltage line;
   a second circuit portion coupled to the second voltage line;
   means for switching an activating current according to the current from the first D.C. source, said means coupled to said first and second voltage lines; and
   a third circuit portion coupled, via said means for switching, to receive the activating current when the first D.C. source is in the on-state and decoupled from the second voltage line when the first D.C. source is in the on-state, wherein said first circuit portion includes analog circuits, and wherein both said second circuit portion and said third circuit portion includes logic circuits.

2. In an integrated circuit, circuitry coupled to first and second voltage lines respectively supplied with current from first and second D.C. sources, the first D.C. source being in one of an off-state and an on-state, said circuitry comprising:
   a first circuit portion coupled to the first voltage line;
   a second circuit portion coupled to the second voltage line;
   means for switching an activating current according to the current from the first D.C. source, said means coupled to said first and second voltage lines; and
   a third circuit portion coupled, via said means for switching, to receive the activating current when the first D.C. source is in the on-state and decoupled from the second voltage line when the first D.C. source is in the off-state, wherein the means for switching includes:
     means for determining when the first D.C. source is in the on-state; and
     means for supplying a non-zero current as the activating current when the first D.C. source is in the on-state and for supplying no current as the activating current when the first D.C. source is in the off-state and the means for determining includes:
       a first resistor having first and second ends, the first end of the first resistor being connected to the first voltage line; and
       a first transistor having a base and a collector, the base being connected to the second end of the first resistor and the means for supplying includes:
         a second transistor having a base and a collector; and
         a second resistor connected between the collector of the first transistor and the base of the second transistor, the collector of the second transistor supplying the activating current.

3. In an integrated circuit, circuitry coupled to first and second voltage lines respectively supplied with current from first and second D.C. sources, the first D.C. source being in one of an off-state and an on-state, said circuitry comprising:
   a first circuit portion coupled to the first voltage line;
   a second circuit portion coupled to the second voltage line;
   means for switching an activating current according to the current from the first D.C. source, said means coupled to said first and second voltage lines;
   a third circuit portion coupled, via said means for switching, to receive the activating current when the first D.C. source is in the on-state and decoupled from the second voltage line when the first D.C. source is in the off-state;
   a first resistor coupled between the second voltage line and the second circuit portion; and
   a second resistor coupled between the second voltage line and the means for switching.

4. In an integrated circuit, circuitry coupled to first and second voltage lines respectively supplied with current from first and second D.C. sources, the first D.C. source being in one of an off-state and an on-state, said circuitry comprising:
   a first circuit portion coupled to the first voltage line;
   a second circuit portion coupled to the second voltage line;
   means for switching an activating current according to the current from the first D.C. source, said means coupled to said first and second voltage lines; and
   a third circuit portion coupled, via said means for switching, to receive the activating current when the first D.C. source is in the on-state and decoupled from the second voltage line when the first D.C. source is in the off-state, wherein the second and third circuit portions include I$^2$L circuits.

5. In an integrated circuit including first, second and third electrical devices, an electrical circuit coupled to first and second voltage lines, the first voltage line being supplied with current from a first D.C. source, the second voltage line being supplied with current from a second D.C. source, the electrical circuit being selectively set in one of a waiting state and a non-waiting state, the waiting state being a state in which the second voltage line is supplied with current from said second D.C. source and the first voltage line is not supplied with current, the non-waiting state being a state in which the first and second voltage lines are respectively supplied with current from said first and second D.C. sources, said electrical circuit comprising:
   first means for supplying current from said first voltage line to the first electrical device while the electrical circuit is in said non-waiting state;
   second means for coupling said second voltage line to the second electrical device; and
   third means for coupling said second voltage line to the third electrical device while the electrical circuit is in said non-waiting state and for decoupling said second voltage line from the third electrical device while the electrical circuit is in said waiting state, wherein the third means includes:
     means for determining when the first voltage line is not supplied with current from the first D.C. source; and
     means for supplying an activating current to the third electrical device when the first voltage line is supplied with current from the first D.C. source and for supplying no current to the third electrical device when the first voltage line is not supplied with current from the first D.C. source and the means for determining includes:
a first resistor having first and second ends, the first end of the first resistor being connected to the first voltage line; and
a first transistor having a base and a collector, the base being connected to the second end of the first resistor and the means for supplying includes:
a second transistor having a base and a collector; and
a second resistor connected between the collector of the first transistor and the base of the second transistor, the collector of the second transistor being coupled to the third electrical device.

6. In an integrated circuit including first, second and third electrical devices, an electrical circuit coupled to first and second voltage lines, the first voltage line being supplied with current from a first D.C. source, the second voltage line being supplied with current from a second D.C. source, the electrical circuit being selectively set in one of a waiting state and a non-waiting state, the waiting state being a state in which the second voltage line is supplied with current from said second D.C. source and the first voltage line is not supplied with current, the non-waiting state being a state in which the first and second voltage lines are respectively supplied with current from said first and second D.C. sources, said electrical circuit comprising:
first means for supplying current from said first voltage line to the first electrical device while the electrical circuit is in said non-waiting state;
second means for coupling said second voltage line to the second electrical device; and
third means for coupling said second voltage line to the third electrical device while the electrical circuit is in said non-waiting state and for decoupling said second voltage line from the third electrical device while the electrical circuit is in said waiting state, wherein:
the second means for coupling includes a first resistor coupled between the second voltage line and the second electrical device; and
the electrical circuit further includes a second resistor coupled between the second voltage line and the third means for coupling.

7. In an integrated circuit including first, second and third electrical devices, an electrical circuit coupled to first and second voltage lines, the first voltage line being supplied with current from a first D.C. source, the second voltage line being supplied with current from a second D.C. source, the electrical circuit being selectively set in one of a waiting state and a non-waiting state, the waiting state being a state in which the second voltage line is supplied with current from said second D.C. source and the first voltage line is not supplied with current, the non-waiting state being a state in which the first and second voltage lines are respectively supplied with current from said first and second D.C. sources, said electrical circuit comprising:
first means for supplying current from said first voltage line to the first electrical device while the electrical circuit is in said non-waiting state;
second means for coupling said second voltage line to the second electrical device; and
third means for coupling said second voltage line to the third electrical device while the electrical circuit is in said non-waiting state and for decoupling said second voltage line from the third electrical device while the electrical circuit is in said waiting state, wherein:
the second and third electrical devices include $I^2L$ circuits;
the second means includes a first resistor for coupling current from the second voltage line to the $I^2L$ circuits of the second electrical device; and
the electrical circuit further includes a second resistor for coupling current from the second voltage line through the third means to the $I^2L$ circuits of the third electrical device.

* * * * *

UNITED STATES PATENT AND TRADEMARK OFFICE
CERTIFICATE OF CORRECTION

PATENT NO. : 6,204,702 B1
DATED : March 20, 2000
INVENTOR(S) : Reiji Tagomori

It is certified that error appears in the above-identified patent and that said Letters Patent is hereby corrected as shown below:

Column 5, claim 1,
Line 30, "on-state" has been replaced with -- off-state --.

Signed and Sealed this

Nineteenth Day of February, 2002

Attest:

JAMES E. ROGAN
Attesting Officer  Director of the United States Patent and Trademark Office